United States Patent [19]
Morris et al.

[11] Patent Number: 5,933,027
[45] Date of Patent: Aug. 3, 1999

[54] HIGH-VOLTAGE-TOLERANT OUTPUT BUFFERS IN LOW-VOLTAGE TECHNOLOGY

[75] Inventors: Bernard L. Morris, Emmaus; Bijit T. Patel, Breinigsville, both of Pa.

[73] Assignee: Lucent Technologies Inc., Murray Hill, N.J.

[21] Appl. No.: 08/879,212

[22] Filed: Jun. 19, 1997

Related U.S. Application Data

[63] Continuation-in-part of application No. 08/818,844, Mar. 14, 1997.

[51] Int. Cl.$^6$ .............................................. H03K 19/0185
[52] U.S. Cl. .................................. 326/81; 326/58; 326/83
[58] Field of Search .................. 326/80–81, 83, 326/86, 57–58, 121, 9

[56] References Cited

U.S. PATENT DOCUMENTS

| | | |
|---|---|---|
| 4,739,193 | 4/1988 | Doty, II ........................ 326/80 |
| 5,004,936 | 4/1991 | Andresen . |
| 5,418,476 | 5/1995 | Strauss ......................... 326/81 |
| 5,629,634 | 5/1997 | Carl et al. .................... 326/58 |
| 5,635,861 | 6/1997 | Chan et al. ................... 326/81 |
| 5,748,010 | 5/1998 | Haque ........................... 326/81 |
| 5,764,077 | 6/1998 | Andresen et al. ............ 326/85 |

*Primary Examiner*—Jon Santamauro

[57] ABSTRACT

An integrated circuit is implemented in a low-voltage technology and has an output driver. The output driver has circuitry adapted to generate an output voltage at an output node (e.g., PAD in FIG. 1) based on an input voltage (e.g., A). Within the output driver, a transistor is configured to limit the drain-to-source voltage drop across another transistor to enable the integrated circuit to tolerate, at its output node, voltages of magnitude up to two times the operating voltage of the integrated circuit. The invention enables low-voltage integrated circuits to be interfaced with other circuitry implemented in a relatively high-voltage technology, without suffering the adverse effects that can otherwise result in the low-voltage circuitry from such interfacing.

24 Claims, 1 Drawing Sheet

HIGH-VOLTAGE-TOLERANT OUTPUT BUFFERS IN LOW-VOLTAGE TECHNOLOGY

This is a continuation-in-part of copending application Ser. No. 08/818,844, filed on Mar. 14, 1997, the teachings of which are incorporated herein by reference.

BACKGROUND OF THE INVENTION

1. Field of the Invention

The present invention relates to integrated circuits, and, in particular, to integrated circuits that are made in a low-voltage technology and designed to operate with integrated circuits that are made in a relatively high-voltage technology.

2. Description of the Related Art

Advances in integrated-circuit (IC) technology often relate to the ever decreasing operating voltages required to operate such circuits. A lower operating voltage may translate into lower costs due to decreases in circuit size and power consumption.

Nevertheless, when a new low-voltage IC technology is developed, it is often desirable for that new technology to be able to operate with existing relatively high-voltage circuitry. The voltage of a particular technology is typically defined by the gate-oxide breakdown voltage and/or the punch-through between the source and drain. One potential problem with interfacing low-voltage circuitry with high-voltage circuitry is that, if the voltages applied to the low-voltage circuitry get too high, one or more of the devices in the low-voltage circuitry may experience temporary or even permanent damage that can inhibit its ability to function properly.

Moreover, as gate oxides continue to shrink to achieve higher speeds, the ability of a metal-oxide semiconductor (MOS) transistor to tolerate higher voltages across the gate or from drain to source is decreased. This can be a problem in interface circuits, generally known as input/output (I/O) buffers, that are part of low-voltage circuitry that is to be connected to relatively high-voltage circuitry.

For example, conventional integrated circuitry implemented in a 2.5 V technology can typically tolerate voltages as high as 3.3 V. Such conventional circuitry cannot however tolerate voltages higher than 3.3 V without experiencing problems. As such, such conventional circuitry cannot be connected to conventional circuitry implemented in a higher-voltage technology, such as a 5 V technology.

It is therefore desirable to design integrated circuitry, such as output drivers, for low-voltage circuitry that are able to handle relatively high voltages so that the low-voltage circuitry can be interfaced and operated with high-voltage circuitry. Further aspects and advantages of this invention will become apparent from the detailed description which follows.

SUMMARY OF THE INVENTION

The present invention is directed to integrated circuits in a low-voltage technology having an output driver that enables the low-voltage circuitry to be interfaced and operated with relatively high-voltage circuitry. Embodiments of the present invention are directed to an integrated circuit in a low-voltage technology having an output driver coupled to other low-voltage technology circuitry. The output driver comprises (a) circuitry adapted to generate an output voltage at an output node (e.g., PAD in FIG. 1) based on an input voltage (e.g., A); (b) a first transistor (e.g., M7) coupled at a first channel node to the output node; and (c) a second transistor (e.g., M11) coupled at a first channel node to a second channel node of the first transistor and coupled at a second channel node to a first reference voltage (e.g., Vdd). The second transistor limits the drain-to-source voltage drop across the first transistor to enable the integrated circuit to tolerate a voltage of magnitude up to two times the first reference voltage at the output node.

In alternative embodiments, the output driver is a pull-up, pull-down output driver comprising (a) a NAND gate adapted to receive an input signal (e.g., A in FIG. 1) and an enable sign (e.g., EN); (b) a first transistor (e.g., M1) connected at a first channel node to the output of the NAND gate and adapted to receive a first reference voltage (e.g., Vdd) at its gate; (c) a second transistor (e.g., M2) connected at a first channel node to the output of the NAND gate and at a second channel node to a second channel node of the first transistor to form a node G1; (d) a third transistor (e.g., M3) connected at a first channel node to the gate of the second transistor to form a node X, at a second channel node to an output node (e.g., PAD), and adapted to receive the first reference voltage; (e) an impedance device (e.g., M4) connected at one end to the node X and adapted to receive a second reference voltage (e.g., Vss) at its other end, wherein the impedance device is either a fourth transistor adapted to receive the first reference voltage, one or more transistors connected in cascade, or a resistor; (f) a fifth transistor (e.g., M5) connected at a first channel node to the node G1, at a second channel node at the output node, and adapted to receive the first reference voltage; (g) a sixth transistor (e.g., M6) connected at a first channel node to the output node, at its gate to the node G1, and adapted to receive the first reference voltage at a second channel node; (h) a seventh transistor (e.g., M7) connected at a first channel node to the output node and adapted to receive the first reference voltage at its gate; (i) an eighth transistor (e.g., M8) connected at a first channel node to a second channel node of the seventh transistor to form a node G3 and adapted to receive a second reference voltage (e.g, Vss) at a second channel node; (j) a ninth transistor (e.g., M9) connected to the node X at its gate and adapted to receive the first reference voltage at a first channel node; (k) a tenth transistor (e.g., M10) connected at a first channel node to a second channel node of the ninth transistor, at a second channel node to the output node, and adapted to receive the first reference voltage at its gate; (l) an eleventh transistor (e.g, (M11) connected at a first channel node to the node G3, at its gate to the node X, and adapted to receive the first reference voltage at a second channel node; and (m) a NOR gate adapted to receive the input signal and an inverted enable sign and connected at its output to the gate of the eighth transistor.

BRIEF DESCRIPTION OF THE DRAWINGS

Other aspects, features, and advantages of the present invention will become more fully apparent from the following detailed description, the appended claims, and the accompanying drawing(s) in which

DETAILED DESCRIPTION

Figure 1:
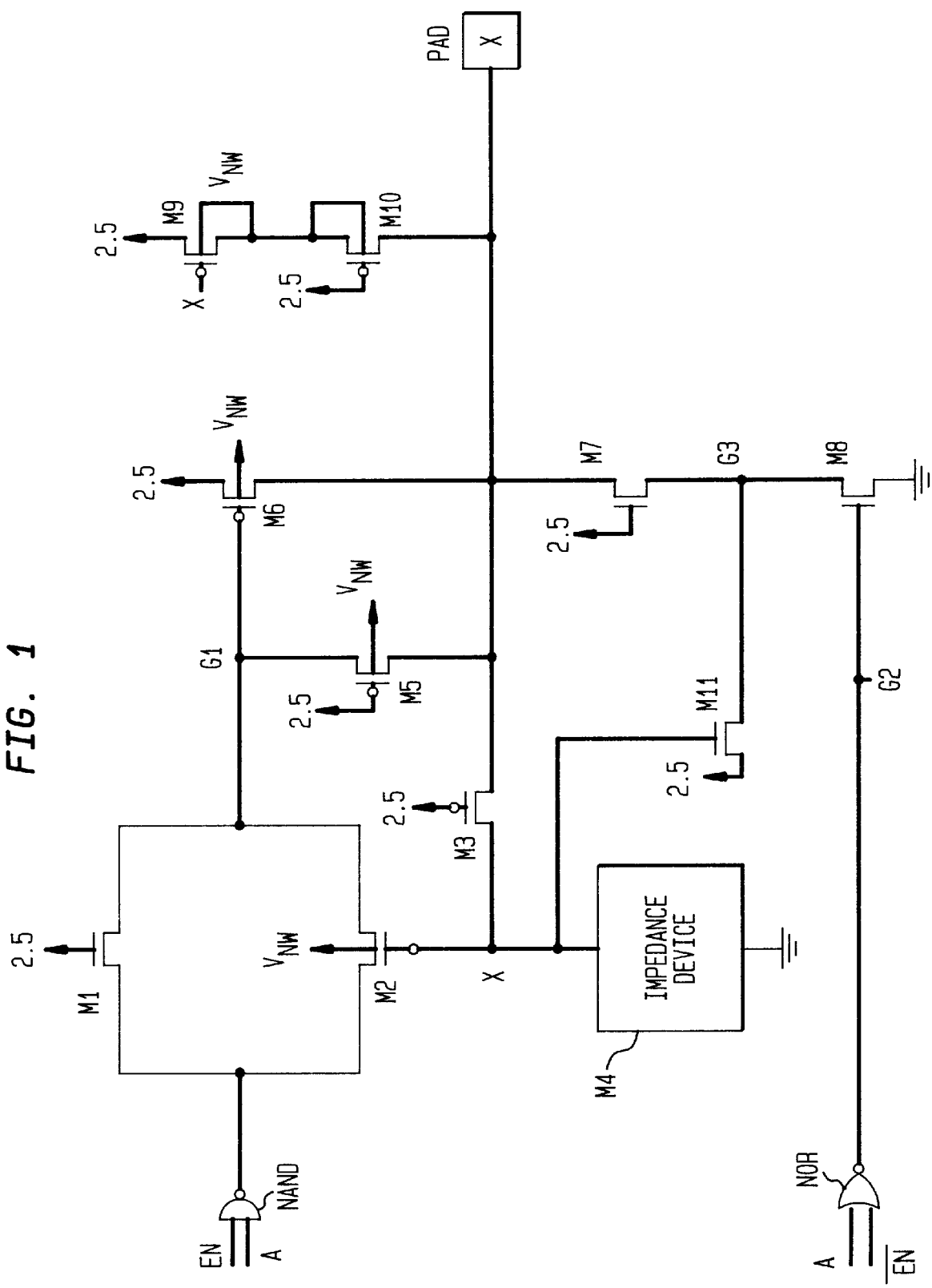
FIG. 1 shows a schematic diagram of a pull-up, pull-down CMOS output driver, according to one embodiment of the present invention.

The present invention is related to output drivers implemented in a low-voltage technology that are able to tolerate voltages that are significantly greater than their operating voltage. For example, under the present invention, 5 V-tolerant output drivers can be implemented in a 2.5 V technology.

FIG. 1 shows a schematic diagram of pull-up, pull-down CMOS output driver 100, according to one embodiment of the present invention. When the enable input EN is high (i.e., logic 1), output driver 100 operates in its "driving" mode. When the enable input EN is low (i.e., logic 0), output driver 100 operates in its "tri-state" or "high impedance (Z)" mode.

During driving-mode operations, the output PAD of output driver 100 follows the logic value of input A. That is, PAD switches between Vdd and Vss (e.g., ground), as input A varies between Vdd and Vss. The NAND and NOR gates are logic blocks that provide tri-state capability.

In one possible implementation, output driver 100 is implemented in a 2.5 V technology (i.e., Vdd=2.5 V). Nevertheless, in this implementation, output driver 100 can operate safely when connected at output node PAD to voltages as high as 5 V, and possibly even higher. As such, 2.5 V-technology output driver 100 can be connected to other circuitry implemented in a 5 V technology.

In one embodiment, transistors M2, M3, M5, M6, M9, and M10 are PMOS-type devices (e.g., pFETs) sharing a common N-well, while transistors M1, M7, M8, and M11 are NMOS-type devices (e.g., nFETs). The biasing of the N-well (Vnw) depends on the voltage at the PAD node (Vpad) relative to Vdd, as explained as follows:

$Vnw=Vdd$ for $Vpad<(Vdd+Vtp)$ $Vnw=Vpad$ for $Vpad>(Vdd+Vtp)$ where Vtp is the threshold voltage of a p-type field-effect transistor (pFET) (e.g., transistor M9).

During driving-mode operations, transistors M3, M5, and M10 are off. Impedance device M4 pulls node X low. A "low" on node X keeps transistor M2 fully on. This allows transmission of voltages between Vss and Vdd to the gate of transistors M6, allowing M6 to turn on and off. A "low" on node X also turns on transistor M9 thereby biasing the N-well voltage Vnw to Vdd. Transistor M11 is off and does not affect driver operation. Thus, during driving-mode operations, output driver 100 behaves like a regular CMOS driver operating between Vss and Vdd, with the N-well biased to Vdd.

During tri-state mode operations, transistors M6 and M8 are off, and output driver 100 is in high-impedance mode. During normal tri-state mode operations, the voltage at nodes G1 and Vnw is Vdd, while node X is kept at Vss.

If the voltage at node PAD goes above (Vdd+Vtp), for example, due to another chip driving the bus to which node PAD is attached, then transistors M3, M5, and M10 turn on. Transistor M3 acts like a source follower for Vpad>(Vdd+Vtp), and the voltage on node X is approximately equal to Vpad. Impedance device M4 is preferably a resistor of about 1–10 Kohms. In another implementation, impedance device M4 can be a long-channel-length transistor (2X–3X minimum) with a relatively high resistance (e.g., about 1–10 Kohms). Alternatively, impedance device M4 can be two or more transistors in cascade.

Since the voltage at node X (Vx) is approximately equal to Vpad, and Vpad is greater than or equal to (Vdd+Vtp), transistor M9 turns off and transistor M10 turns on. Since transistor M10 is on and transistor M9 is off, N-well voltage Vnw follows Vpad and prevents the parasitic pn diode from getting forward biased. Also, since transistor M5 is on, the voltage at node G1 (Vg1) follows voltage Vpad and prevents leakage of current from node PAD to Vdd. Transistor M2 is off due to the fact that the voltage at node X (Vx) is the same as voltage Vpad.

Since voltage Vx is greater than (Vdd+Vtp), transistor M11 turns on (assuming that the threshold voltage of an nFET (Vtn) is approximately equal to the threshold voltage Vtp), and the voltage at node G3 (Vg3) is held at Vdd. The drain-to-source voltage Vds across transistor M7 is therefore (Vpad−Vdd). Thus, transistor M11 has the effect of reducing Vds for transistor M7. When 2.5 V-technology output buffer 100 is connected to a 5 V-technology circuit at node PAD, a typical "worst-case" scenario could have voltage Vdd=2.3 V and voltage Vpad=5.6 V. In this case, Vds for transistor M7 is limited to (5.6 V−2.3 V)=3.3 V, which is a tolerable voltage for 2.5 V-technology circuitry.

Without transistor M11, the voltage at node G3 would be (Vdd−Vtn) and the drain-to-source voltage Vds across transistor M7 would be (Vpad−(Vdd−Vtn)). For Vdd=2.3, Vpad=5.6, and Vtn=0.7 V, Vds across transistor M7 would be (5.6 V−(2.3 V−0.7 V)) or 4.0 V. A drain-to-source voltage Vds across transistor M7 as high as 4.0 V can cause reliability problems due to phenomena like punch-through or snapback.

The present invention provides particular advantages. For example, the drain-to-source voltage Vds and the voltage across the oxide for each transistor in output driver 100 is limited to Vdd5−Vdd, where Vdd5 is the operating voltage for a 5 V-technology circuit. None of the transistor junctions are forward biased, and output driver 100 does not require a Vdd5 supply.

Moreover, output driver 100 does not require series pFETs on the outputs, thereby saving considerable layout area.

The present invention, therefore, allows 2.5 V-technology circuitry to be interfaced to circuitry implemented in as high as a 5 V technology, which would not be otherwise possible without incurring reliability problems.

As previously described, the circuitry of FIG. 1 is implemented in a 2.5-volt technology and can tolerate voltages up to 5 volts, and even higher. As such, the "low-voltage" circuitry of FIG. 1 can be interfaced to "high-voltage" circuitry implemented in a technology up to and including a 5-volt technology. As described earlier, the voltage of a particular technology is typically defined by the gate-oxide breakdown voltage and/or the punch-through between the source and drain. The present invention may also be implemented in a technology other than a 2.5-volt technology. In general, circuitry of the present invention may be implemented in any X-volt technology, and that circuitry will be able to tolerate input voltages up to 2X volts. As such, the circuitry implemented in the X-volt technology is the "low-voltage" circuitry which can be interfaced to "high-voltage" circuitry implemented in (as high as) a 2X-volt technology. For example, circuitry of the present invention may be implemented in a 1.8-volt technology that is adapted to tolerate voltages as high as 3.6 volts. As such, such low-voltage 1.8-volt circuitry may be safely interfaced with relatively high-voltage circuitry of a 3.3-volt technology.

FIG. 1 shows the present invention implemented in a pull-up, pull-down CMOS output driver. Those skilled in the art will understand that the present invention can be implemented in other types of output drivers that are adapted to be interfaced with circuitry in a relatively high-voltage technology.

The use of figure reference labels in the claims is intended to identify one or more possible embodiments of the claimed subject matter in order to facilitate the interpretation of the claims. Such labeling is not to be construed as necessarily limiting the scope of those claims to the embodiments shown in the corresponding figures.

For purposes of this specification, the source and the drain of a transistor are referred to as the two channel nodes of the transistor.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit implemented in a low-voltage technology and having an output driver, the output driver comprising:
   (a) pull-up circuitry adapted to generate an output voltage at an output node based on an input voltage;
   (b) a first transistor coupled at a first channel node to the output node;
   (c) a second transistor coupled at a first channel node to a second channel node of the first transistor and coupled at a second channel node to a first reference voltage, such that the second transistor limits the drain-to-source voltage drop across the first transistor to enable the integrated circuit to tolerate a voltage of magnitude up to two times the first reference voltage at the output node;
   (d) a third transistor connected at a first channel node to the common node between the first and second transistors, at a second channel node to a second reference voltage, and adapted to receive the input voltage at the gate of the third transistor;
   (e) a fourth transistor connected at a first channel node to the gate of the second transistor and connected at a second channel node at the output node: and
   (f) an impedance device connected at one end to the common node between the second and fourth transistors and at another end to the second reference voltage.

2. The invention of claim 1, wherein the impedance device is either a resistor or one or more transistors connected in cascade.

3. The invention of claim 1, wherein the first, second, and third transistors are NMOS-type devices and the fourth transistor is a PMOS-type device.

4. The invention of claim 3, wherein the low-voltage integrated circuit is adapted to be interfaced with integrated circuitry of a relatively high-voltage technology.

5. The invention of claim 1, wherein the low-voltage technology is an X-volt technology and the output driver can tolerate voltages as high as 2X volts at the output node.

6. The invention of claim 5, wherein the X-volt integrated circuit is adapted to be interfaced with integrated circuitry in as high as a 2X-volt technology.

7. The invention of claim 5, wherein the low-voltage technology is a 2.5 V technology and the output driver can tolerate voltages as high as 5 V at the output node.

8. The invention of claim 7, wherein the 2.5 V integrated circuit is adapted to be interfaced with integrated circuitry of a 5 V technology.

9. The invention of claim 5, wherein the low-voltage technology is a 1.8 V technology and the output driver can tolerate voltages as high as 3.6 V at the output node.

10. The invention of claim 9, wherein the 1.8 V integrated circuit is adapted to be interfaced with integrated circuitry of a 3.3 V technology.

11. The invention of claim 1, wherein the low-voltage integrated circuit is adapted to be interfaced with integrated circuitry of a relatively high-voltage technology.

12. The invention of claim 1, wherein the output driver is adapted to operate in a driving mode and a tri-state mode as controlled by an enable voltage input to the circuitry.

13. An integrated circuit implemented in a low-voltage technology and having a pull-up, pull-down output driver, the output driver comprising:
   (a) a NAND gate adapted to receive an input signal and an enable sign;
   (b) a first transistor connected at a first channel node to the output of the NAND gate and adapted to receive a first reference voltage at its gate;
   (c) a second transistor connected at a first channel node to the output of the NAND gate and at a second channel node to a second channel node of the first transistor to form a node G1;
   (d) a third transistor connected at a first channel node to the gate of the second transistor to form a node X, at a second channel node to an output node, and adapted to receive the first reference voltage;
   (e) an impedance device connected at one end to the node X and adapted to receive a second reference voltage at its other end, wherein the impedance device is either a fourth transistor adapted to receive the first reference voltage, one or more transistors connected in cascade, or a resistor;
   (f) a fifth transistor connected at a first channel node to the node G1, at a second channel node at the output node, and adapted to receive the first reference voltage;
   (g) a sixth transistor connected at a first channel node to the output node, at its gate to the node G1, and adapted to receive the first reference voltage at a second channel node;
   (h) a seventh transistor connected at a first channel node to the output node and adapted to receive the first reference voltage at its gate;
   (i) an eighth transistor connected at a first channel node to a second channel node of the seventh transistor to form a node G3 and adapted to receive a second reference voltage at a second channel node;
   (j) a ninth transistor connected to the node X at its gate and adapted to receive the first reference voltage at a first channel node;
   (k) a tenth transistor connected at a first channel node to a second channel node of the ninth transistor, at a second channel node to the output node, and adapted to receive the first reference voltage at its gate;
   (l) an eleventh transistor connected at a first channel node to the node G3, at its gate to the node X, and adapted to receive the first reference voltage at a second channel node; and
   (m) a NOR gate adapted to receive the input signal and an inverted enable sign and connected at its output to the gate of the eighth transistor.

14. The invention of claim 13, wherein:
   the first, fourth, seventh, eighth, and eleventh transistors are NMOS-type devices; and
   the second, third, fifth, sixth, ninth, and tenth transistors are PMOS-type devices.

15. The invention of claim 14, wherein the PMOS-type devices share a common N-well.

16. The invention of claim 15, wherein:
   when the enable voltage is high, the output driver operates in a driving mode in which:
      the third, fifth, tenth, and eleventh transistors are off;
      the fourth transistor is on and pulls the node X low which keeps the second transistor on, thereby allowing transmission of voltages between the first and second reference voltages to the gate of the sixth transistor to turn on and off the sixth transistor; and the low voltage at the node X turns the ninth transistor on, thereby biasing the N-well voltage to the first reference voltage; and when the enable voltage is low, the output driver operates in a tri-state mode in which the eleventh transistor is on, whereby the eleventh transistor operates to limit the drain-to-source voltage across the seventh transistor if a large external voltage is applied to the output node.

17. The invention of claim 15, wherein the low-voltage integrated circuit is adapted to be interfaced with integrated circuitry of a relatively high-voltage technology.

18. The invention of claim 13, wherein the low-voltage technology is an X-volt technology and the output driver can tolerate voltages as high as 2X volts at the output node.

19. The invention of claim 18, wherein the X-volt integrated circuit is adapted to be interfaced with integrated circuitry in as high as a 2X-volt technology.

20. The invention of claim 18, wherein the low-voltage technology is a 2.5 V technology and the output driver can tolerate voltages as high as 5 V at the output node.

21. The invention of claim 20, wherein the 2.5 V integrated circuit is adapted to be interfaced with integrated circuitry of a 5 V technology.

22. The invention of claim 18, wherein the low-voltage technology is a 1.8 V technology and the output driver can tolerate voltages as high as 3.6 V at the output node.

23. The invention of claim 22, wherein the 1.8 V integrated circuit is adapted to be interfaced with integrated circuitry of a 3.3 V technology.

24. The invention of claim 13, wherein the low-voltage integrated circuit is adapted to be interfaced with integrated circuitry of a relatively high-voltage technology.

* * * * *